United States Patent [19]
Nishide et al.

[11] Patent Number: 5,827,605
[45] Date of Patent: Oct. 27, 1998

[54] CERAMIC MULTILAYER SUBSTRATE AND METHOD OF PRODUCING THE SAME

[75] Inventors: Mitsuyoshi Nishide, Otokuni-gun; Hiroji Tani, Nagaokakyo, both of Japan

[73] Assignee: Murata Manufacturing Co., Ltd., Kyoto-fu, Japan

[21] Appl. No.: 576,440

[22] Filed: Dec. 21, 1995

[30] Foreign Application Priority Data

Dec. 21, 1994 [JP] Japan .................................... 6-318666

[51] Int. Cl.$^6$ ...................................................... B32B 9/00
[52] U.S. Cl. ........................ 428/209; 428/210; 428/217; 428/901; 174/250; 174/255; 361/748; 361/750
[58] Field of Search .................................. 428/209, 217, 428/901, 210; 174/250, 255; 361/748, 750

[56] References Cited

U.S. PATENT DOCUMENTS

| | | | |
|---|---|---|---|
| 4,624,896 | 11/1986 | Watanabe | 428/209 |
| 4,795,670 | 1/1989 | Nishigaki | 428/209 |
| 5,294,477 | 3/1994 | Kanba | 428/217 |

*Primary Examiner*—Patrick Ryan
*Attorney, Agent, or Firm*—Ostrolenk, Faber, Gerb & Soffen, LLP

[57] ABSTRACT

The present invention provides a multilayer ceramic substrate and a method of producing the same which can prevent occurrence of cracks when laminating different ceramic substrates or due to subsequent heat shock, and which has excellent moisture resistance and insulation properties and high reliability. The ceramic multilayer substrate has two ceramic substrates of different thermal expansion coefficients laminated by at least two glass layers of different thermal expansion coefficients which are between the thermal expansion coefficients of the ceramic substrates so that the thermal expansion coefficient changes stepwise between the ceramic substrates. The differences in thermal expansion coefficient between the ceramic substrate and the glass layer which are adjacent to each other, and between the adjacent glass layers are preferably not more than $1\times10^{-6}/°\mathrm{C}$.

11 Claims, 1 Drawing Sheet

CERAMIC MULTILAYER SUBSTRATE AND METHOD OF PRODUCING THE SAME

BACKGROUND OF THE INVENTION

1. Field of the Invention

The present invention relates to a ceramic multilayer substrate which can constitute an electronic device or an electronic part.

2. Description of the Related Art

In recent years, ceramic multilayer substrates have frequently been used as substrates for circuits which constitute an electronic device or an electronic part. In order to realize high density and high integration of electronic devices and electronic parts, some ceramic multilayer substrates are in the form of a laminate of individual ceramic substrates having different characteristics, for example, combining a low-dielectric constant substrate with a high-dielectric constant substrate.

A typical example of such multilayer ceramic substrates comprises a first substrate comprising a high-dielectric constant ceramic substrate in which a plurality of capacitors are provided and connected to the surface thereof by wiring and on which a thick film circuit has been formed and a second substrate comprising a low-dielectric constant ceramic substrate in which a plurality of capacitors and coils are provided connected to the surface thereof by wiring with a thick film circuit formed on the surface thereof. The two substrates are laminated by a resin or glass such that the opposing conductors are connected. Other electronic parts are mounted on the surface of the first or second ceramic substrates.

However, the conventional multilayer ceramic substrate comprising a plurality of ceramic substrates having different characteristics which are integrated by laminating has the following problems:

(1) When the integrated ceramic substrates have thermal expansion coefficients which greatly differ, the laminated portions of the ceramic substrates are stressed due to temperature drop or heat shock after the ceramic substrates have been laminated by using melted glass, thereby causing cracks. In order to prevent such cracks, it is necessary that the thermal expansion coefficients of the ceramic substrates to be laminated coincide within each temperature range employed during manufacture and use. Attempts have made to add an additive to the substrates for controlling thermal expansion of the ceramic substrates. However, the addition of such an additive can cause deterioration of the other characteristics of the substrates.

(2) Although it is possible to prevent the occurrence of cracks by using a resin having a low Young's modulus to relieve the stress generated in the laminated portion, such a resin cannot be used where high reliability is required because the moisture resistance of the laminated portion deteriorates.

SUMMARY OF THE INVENTION

Accordingly, an object of the present invention is to provide a multilayer ceramic substrate and a method of producing the same which can prevent the occurrence of cracks when laminating different ceramic substrates or due to subsequent heat shock, and which has excellent moisture resistance and insulating characteristics and high reliability.

DESCRIPTION OF THE INVENTION

In order to achieve the above object, a ceramic multilayer substrate comprises units of two ceramic substrates which have different thermal expansion coefficients and which are laminated by at least two glass layers of different thermal expansion coefficients which are between the thermal expansion coefficients of the two ceramic substrates so that the thermal expansion coefficient changes stepwise between the two ceramic substrates.

In accordance with another embodiment of the present invention, a ceramic multilayer substrate comprises a first ceramic substrate having a passive element which is formed therein and connected to the surface by wiring, and a thick-film circuit formed on the surface; and a second ceramic substrate having a thermal expansion coefficient different from that of the first ceramic substrate, a passive element which is formed therein and connected to the surface, and a thick-film circuit formed on the surface; wherein the two ceramic substrates are laminated by at least two glass layers of different thermal expansion coefficients which are between the thermal expansion coefficients of the two ceramic substrates so that the thermal expansion coefficient changes stepwise between the ceramic substrates, the opposite conductors of the ceramic substrates are connected by conductors formed in the glass layers, and electronic parts are mounted on the surface of the first or second ceramic substrate.

In accordance with a further embodiment of the present invention, a method of producing a multilayer substrate comprises forming, between first and second ceramic substrates having different thermal expansion coefficients, at least two glass layers having different thermal expansion coefficients which are between the thermal expansion coefficients of the first and second ceramic substrates so that the thermal expansion coefficient changes stepwise between the two ceramic substrates, and then laminating the first and second ceramic substrates by heating the glass layers.

In the multilayer ceramic substrate of the present invention, the difference in thermal expansion coefficient between the ceramic substrate and glass layer, which are adjacent to each other, or between the adjacent glass layers is preferably not more than $1 \times 10^{-6}/°$ C.

The multilayer ceramic substrate of the present invention is produced by laminating the ceramic substrates having different thermal expansion coefficients by a plurality of glass layers so that the thermal expansion coefficient changes stepwise. The glass layers decrease the stress caused by the difference between the thermal expansion coefficients of the ceramic substrates as a result of a temperature drop or subsequent heat shock after the ceramic substrates are laminated by using melted glass. The stepwise change may be substantially uniform such that the difference between any two adjacent materials is about the same as the difference between any other two adjacent materials.

When the glass used is selected so that the difference in thermal expansion coefficient between the ceramic substrate and glass layer which are adjacent to each other, or between the adjacent glass layers, is not more than $1 \times 10^{-6}/°$ C., the stress generated is further decreased.

In addition, since the ceramic substrates are laminated by using glass, the resultant multilayer ceramic substrate has excellent moisture resistance and insulation properties, as compared to lamination using a resin.

DESCRIPTION OF A PREFERRED EMBODIMENT

Figure 1:
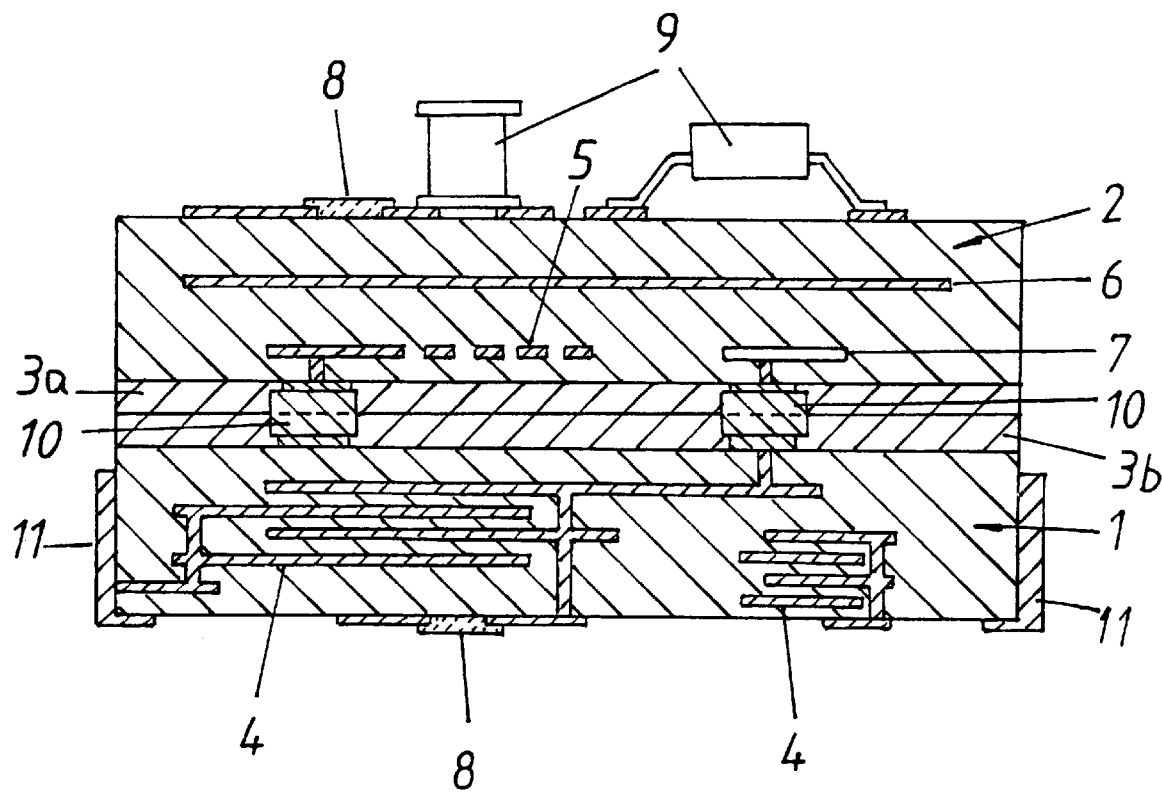
FIG. 1 is a sectional view illustrating a multilayer ceramic substrate in accordance with one embodiment of the present invention.

An embodiment of the present invention will be described below. A ceramic multilayer substrate in accordance with this embodiment comprises a $BaTiO_3$ substrate having a high dielectric constant ($\epsilon$=1000 to 4000) and a thermal expansion coefficient of 10 to $12\times10^{-6}/°$ C. (at 25 to 500° C.), and a $BaO$—$Nd_2O_3$—$TiO_2$ substrate having a low dielectric constant ($\epsilon$=10 to 100) and a thermal expansion coefficient of 8 to $9\times10^{-6}/°C$. (at 25 to 500° C.).

FIG. 1 is a sectional view of the ceramic multilayer substrate. In FIG. 1, reference numeral 1 denotes a high-dielectric constant substrate, reference numeral 2 denotes a low-dielectric constant substrate, and reference numerals 3*a* and 3*b* each denote glass used for laminating the high-dielectric constant substrate 1 to the low-dielectric constant substrate 2. The high-dielectric constant substrate 1 has capacitors 4 formed therein, and the electrodes of the capacitors 4 are led to the surface by wiring. The low-dielectric constant substrate 2 has coils 5, a ground electrode 6 and internal wirings 7, which are formed therein and which are led to the surface by wiring. A thick-film resistor 8 is formed on the surface of each of the high-dielectric constant substrate 1 and the low-dielectric constant substrate 2, and surface mounted parts 9 are mounted on the surface of the low-dielectric constant substrate 2. The circuits of the high-dielectric constant substrate 1 and the low-dielectric constant substrate 2 are electrically connected by via conductors 10, and external connecting end surface electrodes 11 are formed on the surface of the high-dielectric constant substrate 1.

The method of producing the ceramic multilayer substrate will be described below.

The high-dielectric constant substrate 1 having the capacitors 4 formed therein and the thick-film resistor 8 formed on the surface thereof is first formed as follows. An organic binder solution is added to a $BaTiO_3$ ceramic raw material to form a slurry which is then used for forming a ceramic green sheet (referred to as a "green sheet" hereinafter) by the doctor blade method. Holes for via wiring are then formed in the green sheet. A capacitor electrode pattern and a wiring pattern including the via conductors are formed on the green sheet by use of a conductor paste. A predetermined number of the green sheets are stacked to form a laminate. The thus-formed laminate is then baked at 1300° C. to obtain the high-dielectric constant substrate 1 having the capacitors 4 formed therein and in electrical communication with the surface by the via conductors (partly shown in the drawing). A circuit pattern is formed on the surface of the high-dielectric constant substrate 1 by a conductor paste, and the thick-film resistor 8 and the end surface electrodes 11 are also formed on the surface.

On the other hand, the low-dielectric constant substrate 2 having the coils 5, the ground electrode 6 and the internal wirings 7, which are formed therein, and the thick-film resistor 8, which is formed on the surface thereof, is formed. An organic binder solution is added to a $BaO$—$Nd_2O_3$—$TiO_2$ ceramic raw material to form a slurry which is then used for forming a ceramic green sheet by the doctor blade method. Holes for via wiring are then formed in the green sheet, and a spiral coil pattern and a wiring pattern including the ground electrode and via wiring are formed by using a conductor paste. A predetermined number of the green sheets are stacked to form a laminate. The thus-formed laminate is then burnt (baked) at 1250° C., to obtain the low-dielectric constant substrate 2 having the coils 5, the ground electrode 6 and the internal wirings 7, which are formed therein and communicating with the surface by the via conductors (partly shown in the drawing). A circuit pattern is then formed on the surface of the low-dielectric constant substrate 2 by a conductor paste, and the thick-film resistor 8 is also formed on the surface.

Two glass pastes are formed by the following methods: An organic vehicle obtained by dissolving an acrylic resin or ethyl cellulose resin in an organic solvent such as terpineol is added to a glass (referred to as "G1 glass" hereinafter) powder having a composition comprising 0.33 ZnO, 0.50 $B_2O_3$, 0.09 $SiO_2$, 0.04 LiO and 0.04 CaO (ratio by weight, softening point 580° C.), followed by mixing the dispersion to obtain the G1 glass paste. On the other hand, an organic vehicle obtained by dissolving an acrylic resin or ethyl cellulose resin in an organic solvent such as terpineol is added to a glass (referred to as "G2 glass" hereinafter) powder having a composition comprising 0.85 PbO, 0.11 $B_2O_3$, 0.02 $SiO_2$ and 0.02 $Al_2O_3$ (ratio by weight, softening point 400° C.), followed by mixing the dispersion to obtain the G2 glass paste. Similarly, an organic vehicle obtained by dissolving an acrylic resin or ethyl cellulose resin in an organic solvent such as terpineol is added to an Ag-based conductor powder, followed by mixing the dispersion to obtain via conductor paste.

The high-dielectric constant substrate 1 and the low-dielectric constant substrate 2 are laminated by using G1 glass and G2 glass while being electrically connected by the via conductors 10. In other words, the G1 glass paste is coated on a surface of the low-dielectric constant substrate 2, which is to be bonded to the high-dielectric constant substrate 1, by a screen printing method, and then dried. The G1 glass paste is not coated on the via land portions for connecting conductors which is exposed on the surface of the substrate 2, but the via conductor paste is coated on the via land portion and then dried. The G1 glass paste layer and the via conductor paste layer are then burned (baked) on the low-dielectric constant substrate 2 at 610° C. to form the glass layer 3*a* and the via conductors 10. The G2 glass paste is coated on the glass layer 3*a* by the screen printing method, and then dried to form the glass layer 3*b*. The G2 glass paste is not coated on the via conductors 10, but the via conductor paste is coated thereon and dried. A surface of the high-dielectric constant 1 to be bonded is placed on the G2 glass paste of the low-dielectric constant substrate 2, and laminated thereto by melting the glass layer 3*b* by heat treatment at 430° C.

The surface mounted parts 9 are then mounted on the surface of the low-dielectric constant substrate 2 using solder or a conductor paste.

The glass layers 3*a* and 3*b* between the ceramic substrates 1 and 2 prevent occurrence of cracks in the thus-obtained ceramic multilayer substrate at the time of temperature drop after lamination of the ceramic substrates 1 and 2, and improve the subsequent heat shock resistance. Since the ceramic substrates 1 and 2 are laminated together by the glass layers 3*a* and 3*b*, the composite exhibits excellent moisture resistance and insulating properties.

Examples of materials for the $BaTiO_3$ type high-dielectric constant substrate of this embodiment include a material comprising $BaTiO_3$ as a main component and $Nb_2O_5$, $Nd_2O_3$, $Co_2O_3$ or $SiO_2$ added as a secondary component thereto; and a material comprising $BaTiO_3$ as a main component, a bismuth compound such as $Bi_2O_3$—$TiO_2$, $Bi_2O_3$—$SnO_2$ or $Bi_2O_3$—$ZrO_2$, and an oxide of a rare earth element. Examples of materials for the low-dielectric constant substrate include the above-described $BaO$—$Nd_2O_3$—$TiO_2$ type, $MgTiO_3$—$CaTiO_3$ type and $CaTiO_3$—$La_2O_3$·$2TiO_2$—$MgTiO_3$ type and the like. The intended effect of the present invention can be obtained by laminating the different substrates selected from the above examples.

Although this embodiment uses a combination of glass comprising 0.33 ZnO, 0.50 $B_2O_3$, 0.09 $SiO_2$, 0.04 LiO and 0.04 CaO (ratio by weight) and glass comprising 0.85 PbO, 0.11 $B_2O_3$, 0.02 $SiO_2$ and 0.02 $Al_2O_3$ (ratio by weight), the present invention is not limited to this combination. Namely, a plurality of glass materials having excellent insulation properties and thermal expansion coefficients which are between the thermal expansion coefficients of the two ceramic substrates to be laminated can be selected from various glass materials such as lead borosilicate glass, bismuth borosilicate glass, zinc borosilicate glass and the like. The selected glass materials are disposed in layers so that the thermal expansion coefficient changes stepwise, thereby preventing the occurrence of cracks due to a different between thermal expansion coefficients. More than two layers may be employed.

When the types of glass used are selected, and the number of glass layers is determined, so that the difference in thermal expansion coefficient between the ceramic substrate and glass layer, which are adjacent to each other, or between the adjacent glass layers, is not more than $1\times10^{-6}/°$ C., the stress generated can be further decreased.

Although a thick glass layer used for laminating has the greatest effect in relieving stress, a thickness of not less than 5 $\mu$m is generally sufficient.

In order to securely remove the organic component in the glass paste layers when the substrates are laminated by melting the glass by heating, it is preferable to previously decompose and remove the organic component in the paste layers by heating beforehand, or to melt the glass layers by a heat treatment for a time sufficient to remove the organic component.

As is obvious from the above description, the multilayer ceramic substrate of the present invention comprises ceramic substrates which have different thermal expansion coefficients and which are laminated by a plurality of glass layers so that the thermal expansion coefficient changes stepwise between the ceramic substrates. The glass layers thus permit the formation of a ceramic multilayer substrate which minimizes or prevents occurrence of cracks when there is a temperature drop or heat shock after lamination by melting glass.

When the types of glass used are further selected so that the difference in thermal expansion coefficient between the adjacent ceramic substrate and glass layer which are adjacent to each other or between the adjacent glass layers is not more than $1\times10^{-6}/°$ C., the stress generated can be further decreased, thereby further improving the crack resistance of the ceramic multilayer substrate.

Since the stress generated due to the difference in thermal expansion coefficient between the ceramic substrates is relieved, it is possible to bond large substrates, which cannot be laminated by a conventional method, and thus obtain a large integrated substrate and a parent substrate from which may be obtained many substrates.

In the present invention, a multilayer substrate having high reliability can be obtained since the ceramic substrates are laminated by glass having good moisture resistance and insulation properties, and not by a resin adhesive, for relieving the difference between thermal expansion coefficients.

What is claimed is:

1. A multilayer ceramic substrate comprising two ceramic substrates which have different thermal expansion coefficients laminated together by at least two layers consisting essentially of glass which have different thermal expansion coefficients which are between the thermal expansion coefficients of the two ceramic substrates, whereby the thermal expansion coefficient changes stepwise between the two ceramic substrates.

2. A multilayer ceramic substrate according to claim 1 wherein the first ceramic substrate has a passive element formed therein and connected to a surface thereof by a conductor, and a thick-film circuit formed on a surface thereof; and the second ceramic substrate having a thermal expansion coefficient different from that of the first ceramic substrate has a passive element formed therein and connected to a surface by a conductor, and a thick-film circuit formed on a surface thereof; and opposing conductors in the two substrates are connected by via conductors in the glass layers.

3. A multilayer ceramic substrate according to claim 2 having an electronic part is mounted on the surface of the first or second ceramic substrate.

4. A multilayer ceramic substrate according to claim 3, wherein the difference in thermal expansion coefficient between a ceramic substrate and adjacent glass layer or between the adjacent glass layers is not more than $1\times10^{-6}/°$ C.

5. A multilayer ceramic substrate according to claim 4, wherein each of the stepwise changes in thermal coefficient are about equal.

6. A multilayer ceramic substrate according to claim 1, wherein each of the stepwise changes in thermal coefficient are about equal.

7. A multilayer ceramic substrate according to claim 6, wherein the difference in thermal expansion coefficient between a ceramic substrate and adjacent glass layer or between the adjacent glass layers is not more than $1\times10^{-6}/°$ C.

8. A multilayer ceramic substrate according to claim 1, wherein the difference in thermal expansion coefficient between a ceramic substrate and adjacent glass layer or between the adjacent glass layers is not more than $1\times10^{-6}/°$ C.

9. A multilayer ceramic substrate according to claim 6 wherein said glass layers comprise a plurality of glass materials selected from lead borosilicate glass, bismuth borosilicate glass and zinc borosilicate glass.

10. A multilayer ceramic substrate according to claim 1 wherein said glass layers comprise a plurality of glass materials selected from lead borosilicate glass, bismuth borosilicate glass and zinc borosilicate glass.

11. A multilayer ceramic substrate according to claim 1, wherein each glass layer comprises a borosilicate.

* * * * *